United States Patent (10) Patent No.: US 11,961,568 B2
Senoo et al. (45) Date of Patent: Apr. 16, 2024

(54) SEMICONDUCTOR DEVICE AND READING METHOD

(71) Applicant: Winbond Electronics Corp., Taichung (TW)

(72) Inventors: Makoto Senoo, Kanagawa (JP); Sho Okabe, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 118 days.

(21) Appl. No.: 17/704,006

(22) Filed: Mar. 25, 2022

(65) Prior Publication Data

US 2022/0319614 A1 Oct. 6, 2022

(30) Foreign Application Priority Data

Apr. 6, 2021 (JP) ................... 2021-064599

(51) Int. Cl.
*G11C 16/00* (2006.01)
*G11C 16/24* (2006.01)
(Continued)

(52) U.S. Cl.
CPC ............. *G11C 16/26* (2013.01); *G11C 16/24* (2013.01); *G11C 16/30* (2013.01)

(58) Field of Classification Search
CPC ..... G11C 16/0483; G11C 16/26; G11C 16/24; G11C 16/08; G11C 16/30; G11C 16/10; G11C 11/5642; G11C 16/3418; G11C 11/5628; G11C 16/06; G11C 16/14; G11C 16/3454; G11C 7/02; G11C 7/18;
(Continued)

(56) References Cited

U.S. PATENT DOCUMENTS 8,737,140 B2 * 5/2014 Kim ....................... G11C 16/24
365/185.24
9,330,739 B2 5/2016 Lee
(Continued)

FOREIGN PATENT DOCUMENTS

CN 101211660 7/2008
JP 5323170 10/2013
(Continued)

OTHER PUBLICATIONS

"Office Action of Taiwan Counterpart Application", dated Jun. 7, 2022, p. 1-p. 6.

*Primary Examiner* — Thong Q Le
(74) *Attorney, Agent, or Firm* — JCIPRNET

(57) ABSTRACT

The disclosure provides a semiconductor device and a reading method capable of achieving high-speed reading performance. A NAND flash memory according to the disclosure includes: a bit line selection circuit for selecting an even-numbered bit line or an odd-numbered bit line, and a page buffer/reading circuit connected to the bit line selection circuit. A reading method of a flash memory includes: precharging the selected bit line with a virtual power supply (VIRPWR) connected to the bit line selection circuit (step #1); and initializing a latch circuit (L1) through a voltage supply node V1 in parallel with the precharging of the selected bit line (step #1_2); and initializing the page buffer/reading circuit 170 through the voltage supply node V1 (step #1_3).

15 Claims, 8 Drawing Sheets

(51) Int. Cl.
*G11C 16/26* (2006.01)
*G11C 16/30* (2006.01)

(58) Field of Classification Search
CPC . G11C 16/32; G11C 16/3404; G11C 16/3427;
G11C 16/12; G11C 16/34; G11C 7/12
USPC ........ 365/185.25, 185.22, 185.18, 185.24, 1,
365/185.2, 185.11, 185.14, 185.17
See application file for complete search history.

(56) References Cited

U.S. PATENT DOCUMENTS

| | | |
|---|---|---|
| 2005/0213378 A1 | 9/2005 | Chang |
| 2013/0250698 A1* | 9/2013 | Kim ...................... G11C 16/24 |
| | | 365/185.25 |

FOREIGN PATENT DOCUMENTS

| | | |
|---|---|---|
| JP | 5667143 | 2/2015 |
| TW | I254941 | 5/2006 |
| TW | I514390 | 12/2015 |

* cited by examiner (A)

(B)

SEMICONDUCTOR DEVICE AND READING METHOD

CROSS-REFERENCE TO RELATED APPLICATION

This application claims the priority benefit of Japan application serial no. 2021-064599, filed on Apr. 6, 2021. The entirety of the above-mentioned patent application is hereby incorporated by reference herein and made a part of this specification.

BACKGROUND

Technical Field

The disclosure relates to a semiconductor device including a NAND flash memory and the like, and more particularly relates to a reading method of a flash memory.

Description of Related Art

A NAND flash memory is provided with a reading function (burst reading function) for reading a plurality of pages in response to an external command. A page buffer/reading circuit includes, for example, two latches, and can output the data held in one latch while holding the data read from an array in the other latch when performing a reading operation.

SUMMARY

FIG. 1 is a circuit diagram showing the configuration of a page buffer circuit of a NAND flash memory and a bit line selection circuit connected thereto. Here, one page buffer/reading circuit 10 shared by the even-numbered bit line GBLe and the odd-numbered bit line GBLo is shown. For convenience, the signal applied to the gate of the transistor is used to represent the transistor.

The page buffer/reading circuit 10 includes two latches L1 and L2. The transfer transistors TR1 and TR2 are connected between the latch L1 and the latch L2, and bidirectional data transfer can be performed between the latch L1 and the latch L2. The node SLR1 of the latch L1 is connected to the common S/D of the transistor BLCD1 and the transistor DTG, and the node SLR2 of the latch L2 is connected to the transistor BLCD2. In the program verification, the transistor DTG selectively charges the voltage VDD from the voltage supply node V2 to the node SLR1 or selectively discharges the node SLR1 to GND. Further, the latch L2 is connected to the input/output circuit through the data line DL and the data line/DL (not shown).

The transistor VG and the transistor REG are connected in series between the voltage supply node V2 and the reading node SNS, and the gate of the transistor VG is connected to the S/D of the transistor DTG. The voltage supply node V1 is connected to the reading node SNS through the transistor BLPRE. The voltage supply node V1 supplies the voltage VDD when precharging the bit line, and supplies GND when resetting the latch L1. The transistor BLCN and the transistor BLCLAMP are connected in series between the reading node SNS and the node BLS.

The bit line selection circuit 20 includes the transistor BLSe for selecting the even-numbered bit line GBLe, the transistor BLSo for selecting the odd-numbered bit line GBLo, the transistor YBLe for connecting the virtual power supply VIRPWR to the even-numbered bit line GBLe, and the transistor YBLo for connecting the virtual power supply VIRPWR to the odd-numbered bit line GBLo. A NAND string is connected between the even-numbered bit line GBLe/the odd-numbered bit line GBLo and the source line SL. In the reading operation, when the even-numbered bit line GBLe is selected, the odd-numbered bit line GBLo is not selected, and when the odd-numbered bit line GBLo is selected, the even-numbered bit line GBLe is not selected. A precharge voltage is supplied to the selected bit line, and GND is supplied to the non-selected bit line.

For the conventional page reading as shown by the dashed lines in FIG. 2 and FIG. 3, it is necessary to initialize the bit line (S10), initialize the latch L1 (S20), initialize the page buffer circuit (S30), and precharge the selected bit line (S40). The operation of the steps S10 to S40 will be described with reference to the timing chart of FIG. 4. Here, it is assumed that the even-numbered bit line GBLe is selected.

At the time t1, the virtual power supply VIRPWR is set to the GND level, the transistor YBLe and the transistor YBLo are turned on (H level), the bit line GBLe and the bit line GBLo are set to GND, and the bit line GBLe and the bit line GBLo are initialized (S10). The initialization of the bit line is performed to stabilize the reading of the read data.

In parallel with the bit line initialization, during the period from the time t1 to the time t2, the voltage supply node V1 is set to the GND level, the transistor BLPRE and the transistor BLCD1 are turned on (H level), the node SLR1 is set to the L level (GND) (L1 SET L), and the latch L1 is initialized (S20). The initialization of the latch L1 is performed to stabilize the reading of the read data.

During the period from the time t3 to the time t4, the voltage supply node V1 is set to VDD (internal supply voltage: for example, 2.0V), the transistor BLPRE, the transistor BLCLAMP, and the transistor BLCN are sequentially turned on (H level), the transistor YBLe is turned off, the reading node SNS is charged to VDD, the node TOBL and the node BLS are charged to VCLMP1 (VCLMP1<VDD), and the page buffer/reading circuit is initialized (S30). At this time, the voltage VCLMP1+Vth (Vth is the threshold value of the transistor BLCLAMP1) is applied to the gate of the transistor BLCLAMP, and a sufficiently high voltage is applied to the gates of the transistor BLPRE and the transistor BLCN so that VDD can pass through the node SNS and the node BLS.

Next, at the time t4, the transistor BLSe is turned on, the voltage VCLMP1 is supplied to the even-numbered bit line GBLe, and the selected bit line GBLe is precharged (S40) to prepare for reading the selected memory cell. On the other hand, during the precharging period of the selected bit line GBLe, the non-selected bit line GBLo is electrically connected to the GND level of the virtual power supply VIRPWR through the transistor YBLo. By forcibly setting the non-selected bit line GBLo to GND, it becomes a bit-line shield and noise due to coupling is reduced, which stabilizes the reading of the read data and maintains the data retention characteristics of the NAND string connected to the non-selected bit line.

For example, it takes about 1 μs to process step S10 to step S20, about 1 μs to process step S30, and 5 μs to 6 μs to process step S40, and it takes about 7 μs to 8 μs to set up the page buffer/reading circuit and the bit line. Further, when the flash memory performs ECC (error checking and correction), the reading time may become longer.

In view of the above, the disclosure provides a semiconductor device and a reading method capable of achieving high-speed reading performance.

The reading method according to the disclosure is adapted for a NAND flash memory which includes a bit line selection circuit for selecting an even-numbered bit line or an odd-numbered bit line, and a page buffer/reading circuit connected to the bit line selection circuit. The reading method includes: a first step of precharging a selected bit line with a supply voltage of a first voltage supply source connected to the bit line selection circuit; and a second step of initializing a latch of the page buffer/reading circuit with a supply voltage of a second voltage supply source connected to the page buffer/reading circuit in parallel with precharging of the selected bit line.

In an embodiment, the reading method further includes a third step of initializing a reading node of the page buffer/reading circuit with the supply voltage of the second voltage supply source after initializing the latch in parallel with precharging of the selected bit line. In an embodiment, the second step and the third step are performed in a precharging period of the selected bit line. In an embodiment, the second voltage supply source supplies a GND level for the second step and supplies VDD for the third step. In an embodiment, the reading method further includes a fourth step of initializing the selected bit line with the supply voltage of the first voltage supply source before precharging of the selected bit line. In an embodiment, the reading method further includes a fifth step of bit-line shielding a non-selected bit line with the supply voltage of the second voltage supply source. In an embodiment, the fifth step further includes connecting the supply voltage of the first voltage supply source to the non-selected bit line, and connecting the bit line selection circuit to the page buffer/reading circuit. In an embodiment, the fifth step and the second step are performed simultaneously. In an embodiment, when precharging of the selected bit line is started, a transistor connected between the first voltage supply source and the selected bit line is turned on. In an embodiment, the first voltage supply source supplies a voltage at a precharge level, and the transistor is turned on so that the precharge level does not drop.

The semiconductor device according to the disclosure includes: a NAND memory cell array, a reading component reading data from a selected page of the memory cell array, and an output component outputting the data read by the reading component to the outside. The reading component includes a bit line selection circuit selecting an even-numbered bit line or an odd-numbered bit line, and a page buffer/reading circuit connected to the bit line selection circuit. The reading component precharges a selected bit line with a supply voltage of a first voltage supply source connected to the bit line selection circuit, and initializes a latch of the page buffer/reading circuit with a supply voltage of a second voltage supply source connected to the page buffer/reading circuit in parallel with precharging of the selected bit line.

In an embodiment, the reading component further initializes a reading node of the page buffer/reading circuit with the supply voltage of the second voltage supply source after initializing the latch in parallel with precharging of the selected bit line. In an embodiment, the reading component further initializes the selected bit line with the supply voltage of the first voltage supply source before precharging of the selected bit line. In an embodiment, the reading component further performs bit-line shielding on a non-selected bit line with the supply voltage of the second voltage supply source. In an embodiment, the reading component further performs bit-line shielding on the non-selected bit line and initializes the latch simultaneously. In an embodiment, a transistor connected between the first voltage supply source and the selected bit line is turned on when precharging of the selected bit line is started. In an embodiment, the reading component includes a detecting component detecting a voltage of a bit line, and the reading component turns on the transistor so that the supply voltage of the first voltage supply source does not drop, and turns off the transistor when a precharge voltage is detected by the detecting component. In an embodiment, the reading component outputs a voltage at a precharge level from the first voltage supply source, and turns on the transistor so that the voltage at the precharge level does not drop. In an embodiment, the reading component includes a unity gain buffer that outputs the voltage at the precharge level. According to the disclosure, the latch of the page buffer/reading circuit is initialized in parallel with the precharging of the selected bit line. Therefore, high-speed reading can be achieved as compared with the conventional technology. Furthermore, since the selected bit line is precharged from the first voltage supply source of the bit line selection circuit, charging of the reading node, etc. is not required and it is possible to perform rapid precharging as compared with the case where the selected bit line is precharged from the second voltage supply source of the page buffer/reading circuit.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 5:
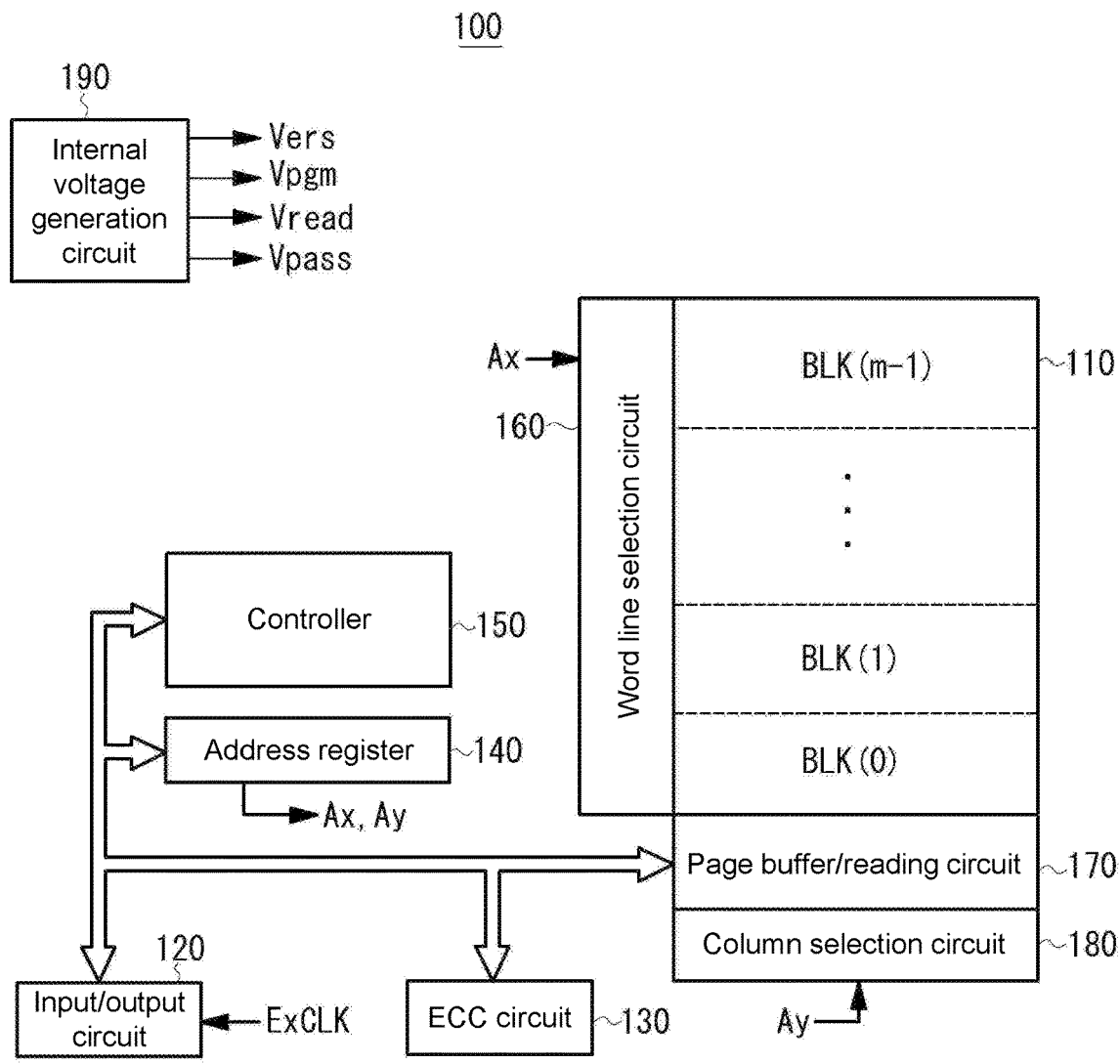
FIG. 5 is a block diagram showing the configuration of a NAND flash memory according to an embodiment of the disclosure.

Next, exemplary embodiments of the disclosure will be described in detail with reference to the drawings. FIG. 5 is a diagram showing the configuration of a NAND flash memory according to an embodiment of the disclosure. The flash memory 100 according to this embodiment includes: a memory array 110 in which a plurality of memory cells are arranged in a matrix; an input/output circuit 120 which outputs read data to the outside or receives data input from the outside; an ECC circuit 130 which generates a code of data to be programmed or detects/corrects an error in the read data; an address register 140 which receives address data through the input/output circuit 120; a controller 150 which controls each part based on command data received through the input/output circuit 120 and a control signal applied to the terminal; a word line selection circuit 160 which receives row address information Ax from the address register 140, decodes the row address information Ax, and selects a block or a word line based on the decoding result; a page buffer/reading circuit 170 which holds the data read from the page selected by the word line selection circuit 160 or holds the data to be programmed to the selected page; a column selection circuit 180 which receives column address information Ay from the address register 140, decodes the column address information Ay, and selects a column in the page buffer/reading circuit 170 based on the decoding result; and an internal voltage generation circuit 190 which generates various voltages (writing voltage Vpgm, pass voltage Vpass, reading pass voltage Vread, erasing voltage Vers, internal supply voltage VDD, etc.) required for reading, programming, erasing, etc. of the data.

The memory array 110 has, for example, m memory blocks BLK arranged along the row direction, and a plurality of NAND strings in which a plurality of memory cells are connected in series are formed in one memory block. One NAND string includes a plurality of memory cells connected in series, a bit line side selection transistor, and a source line side selection transistor. The drain of the bit line side selection transistor is connected to one corresponding bit line, and the source of the source line side selection transistor is connected to the common source line. The control gate of the memory cell is connected to the word line, and the gates of the bit line side selection transistor and the source line side selection transistor are connected to the selection gate line, respectively. The NAND string may be formed two-dimensionally on the surface of a substrate or may be formed three-dimensionally on the surface of a substrate.

The word line selection circuit 160 drives the bit line side selection transistor and the source line side selection transistor through the selection gate line based on the row address Ax to select a block or a word. The column selection circuit 180 selects a bit line according to the column address Ay, and selects, for example, the reading start position of the data in a page. Further, the word line selection circuit 160 and the column selection circuit 180 may include a column address counter and a row address counter that increment the column address and the row address in response to a clock signal.

Figure 1:
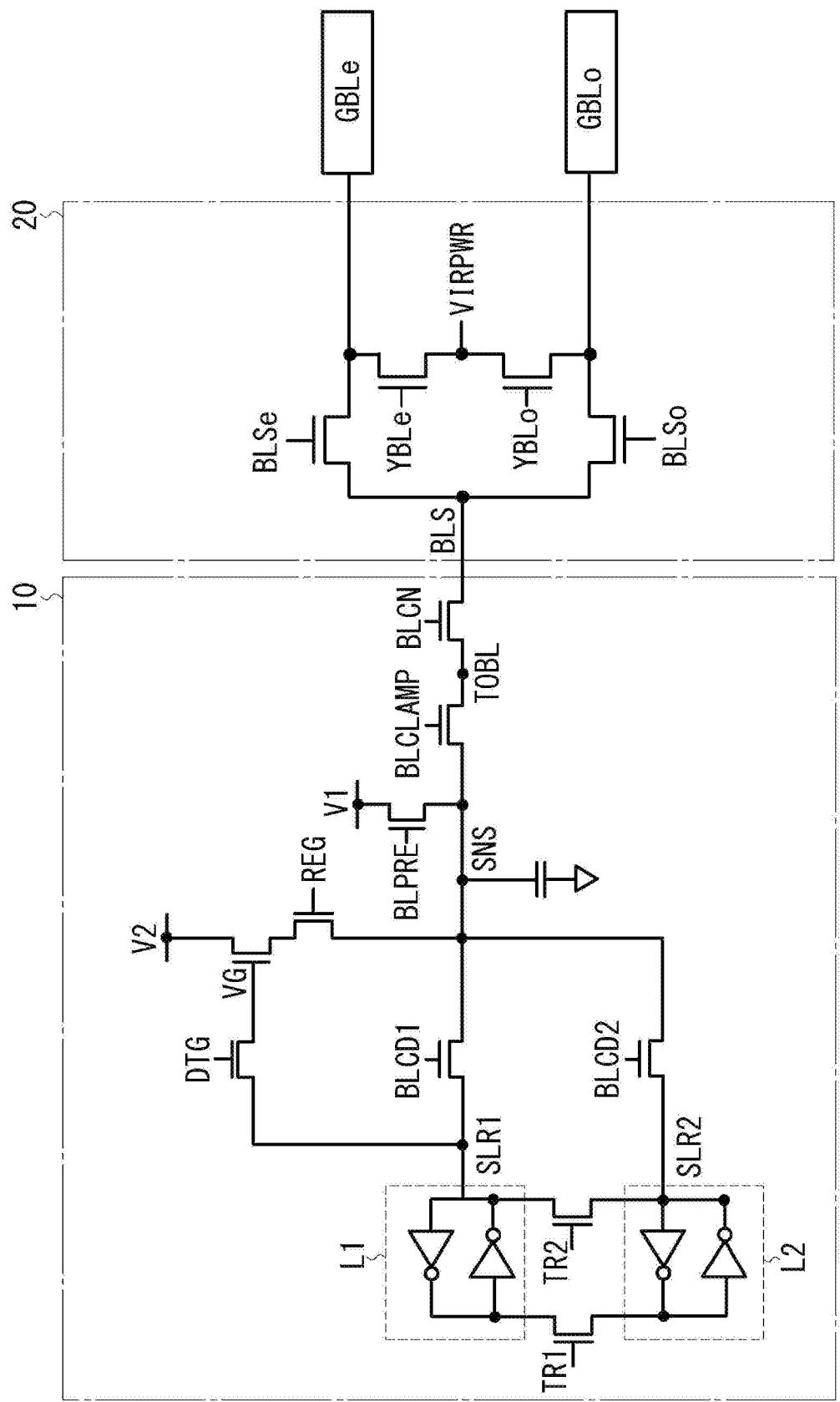
FIG. 1 is a circuit diagram showing the configuration of a page buffer/reading circuit and a bit line selection circuit of a NAND flash memory.

The page buffer/reading circuit 170 is configured in the same manner as the page buffer/reading circuit 10 shown in FIG. 1, and is connected to the even-numbered bit line GBLe and the odd-numbered bit line GBLo through the bit line selection circuit 20.

The controller 150 is configured by using a microcontroller, a state machine or the like, and controls the operation of the flash memory 100. In the reading operation, a positive voltage is applied to the bit line, a voltage (for example, 0V) is applied to the selected word line, the pass voltage Vpass (for example, 4.5V) is applied to the non-selected word line, the bit line side selection transistor and the source line side selection transistor are turned on, and 0V is applied to the common source line. In the programming operation, a high programming voltage Vpgm (15V to 20V) is applied to the selected word line, an intermediate potential (for example, 10V) is applied to the non-selected word line, the bit line side selection transistor is turned on, the source line side selection transistor is turned off, and the potential corresponding to the data of "0" or "1" is supplied to the bit line. In the erasing operation, 0V is applied to the selected word line in the block, a high voltage (for example, 20V) is applied to the P well, and the electrons of the floating gate are drawn out to the substrate to erase the data in the unit of blocks.

Figure 2:
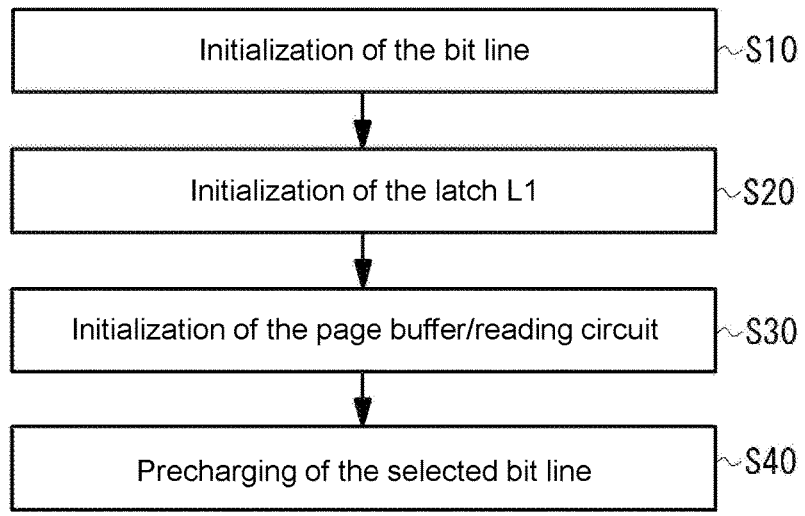
FIG. 2 is a flowchart illustrating the steps of the conventional reading operation.
Figure 3:
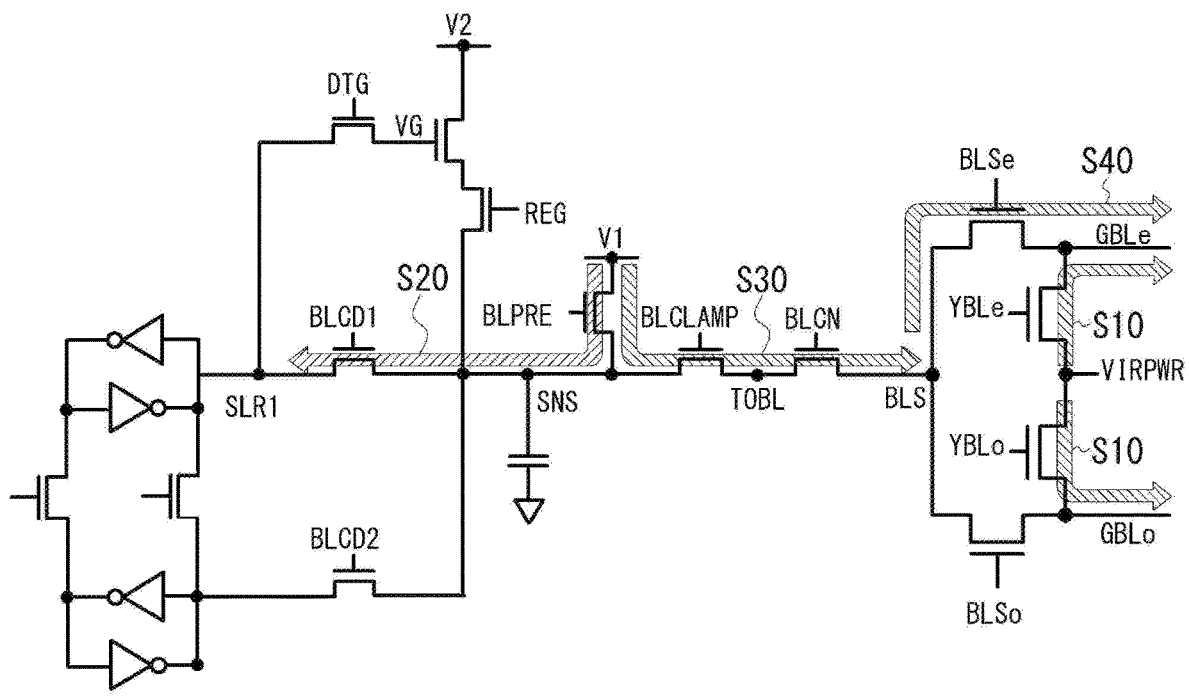
FIG. 3 is a diagram showing the signal flow in each step of the conventional reading operation.
Figure 4:
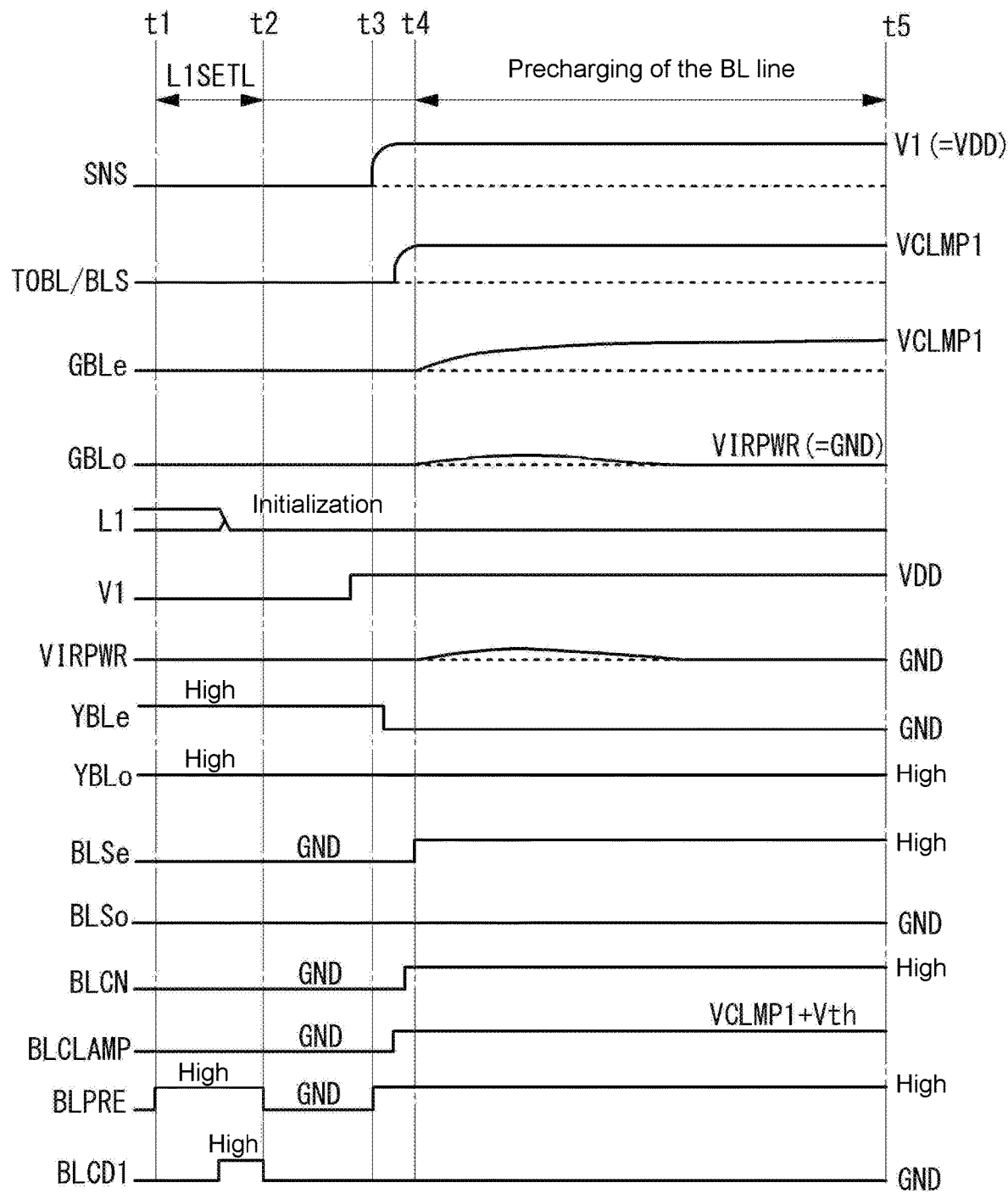
FIG. 4 is a timing chart of the conventional reading operation.

Next, the reading operation of the flash memory 100 according to this embodiment will be described. In order to realize high-speed reading as compared with the conventional technology, the flash memory 100 of this embodiment is provided with a high-speed page reading mode for performing "initialization of the bit line," "initialization of the latch L1," "initialization of the page buffer/reading circuit," and "precharging of the selected bit line" in parallel instead of sequentially as in shown in FIG. 2.

Figure 6:
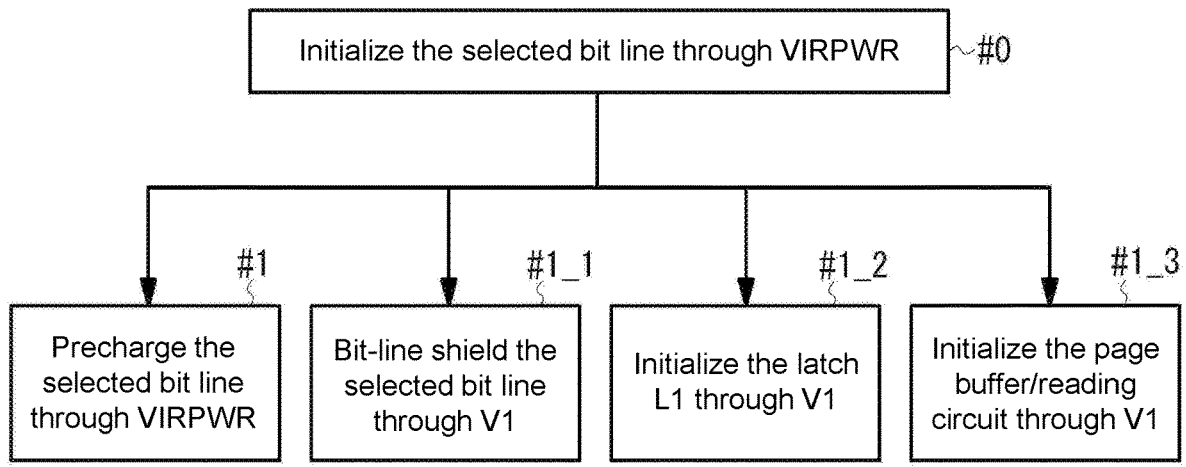
FIG. 6 is a flowchart illustrating the steps of the reading operation according to an embodiment of the disclosure.
Figure 7:
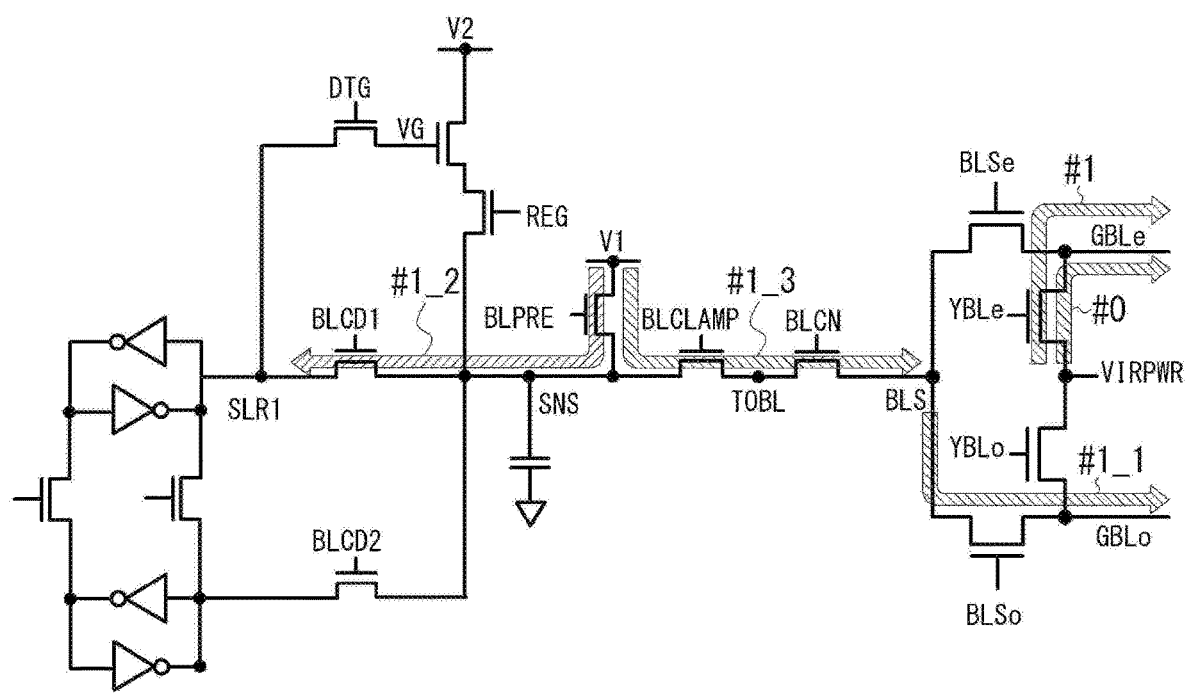
FIG. 7 is a diagram showing the signal flow in each step of the reading operation according to an embodiment of the disclosure.

FIG. 6 is a diagram showing the operation flow of the high-speed reading mode according to this embodiment, and FIG. 7 is a diagram showing the signal flow in the high-speed reading mode. The high-speed page reading mode of this embodiment includes: step #0 of initializing the selected bit line through the virtual power supply VIRPWR, step #1 of precharging the selected bit line through the virtual power supply VIRPWR after step #0, step #1_1 of bit-line shielding the non-selected bit line through the voltage supply node V1, step #1_2 of resetting the latch L1 through the voltage supply node V1, and step #1_3 of initializing the page buffer/reading circuit through the voltage supply node V1. These steps are controlled by the controller 150. Step #0 may not only include initializing the selected bit line through VIRPWR but also include a step of initializing the non-selected bit line to GND. However, if the non-selected bit line is bit-line shielded through the voltage supply node V1 in step #1_1, the non-selected bit line is also initialized to GND as a result.

During the period of step #1 of precharging the selected bit line through the virtual power supply VIRPWR, at least step #1_2 of initializing the latch L1 through the voltage supply node V1 and step #1_3 of initializing the page buffer/reading circuit through the voltage supply node V1 are performed in parallel. In addition, the parallel operation may include step #1_1 of bit-line shielding the non-selected bit line through the voltage supply node V1. At least, step #1_1 and step #1_2 use the GND of the voltage supply node V1 so simultaneous execution is possible.

By the parallel operation of step #1 and step #1_2 and step #1_3, during the period in which the selected bit line is precharged, the operations of the initialization of the latch L1 and the initialization of the page buffer/reading circuit 170 are hidden, and the reading time can be shortened. Further, the precharging of the selected bit line performed through the virtual power supply VIRPWR is different from the precharging from the voltage supply node V1, and it does not charge the capacity of the reading node SNS, the node TOBL, and the node BLS, and does not go through the transistor BLCLAMP, the transistor BLCN, and the transistors BLSe/BLSo. Therefore, it is possible to realize quick precharging with a shortened precharging time. In addition, by performing step #1_1 in parallel with step #1 and executing it at the same time as step #1_2, it is also possible to bit-line shield the non-selected bit line and reduce the noise due to coupling without a time penalty.

Figure 8:
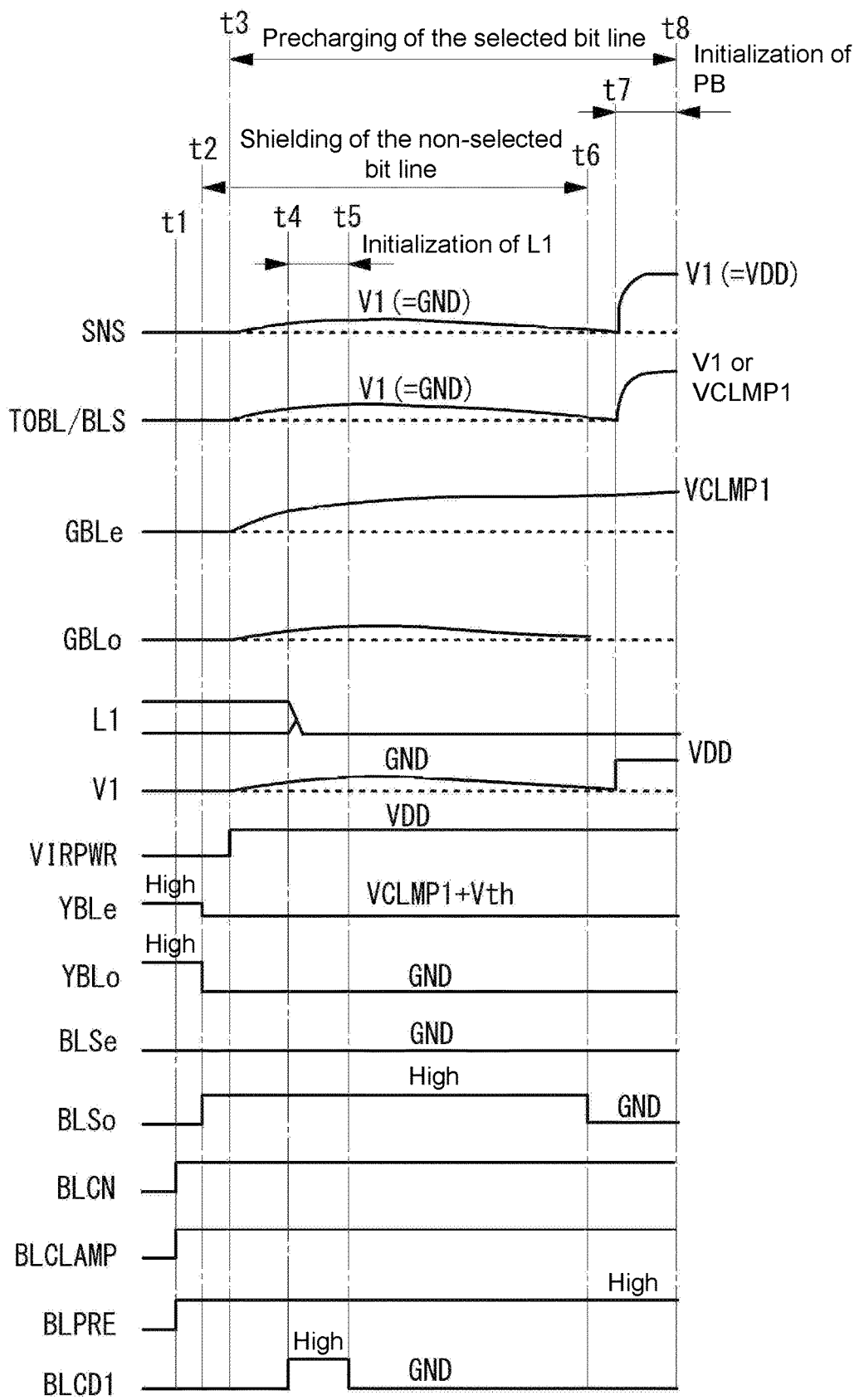
FIG. 8 is a timing chart of the reading operation according to an embodiment of the disclosure.

Next, the detailed operation of the high-speed reading mode according to this embodiment will be described with reference to the timing chart of FIG. 8. It is assumed that the even-numbered bit line GBLe is selected and the odd-numbered bit line GBLo is not selected.

At the time t1, the virtual power supply VIRPWR is set to GND, the H level is applied to the gate of the transistor YBLe, the transistor YBLe is turned on, the selected bit line GBPe is electrically connected to the GND level, and the selected bit line GBPe is initialized (step #0). At this time, the transistor YBLo may be turned on in the same manner, and the non-selected bit line GBLo may be electrically connected to the GND level. At the time t1, the transistors BLSe/BLSo are turned off, and the even-numbered bit line GBLe and the odd-numbered bit line GBLo are disconnected from the node BLS.

Furthermore, the voltage supply node V1 is set to GND, the transistor BLCN, the transistor BLCLAMP, and the transistor BLPRE are turned on, and as a result, the reading node SNS, the node TOBL, and the node BLS are electrically connected to the GND level.

At the time t2, the gate of the transistor YBLe is transitioned from the H level (for example, VDD or VCLMP1+Vth) to VCLMP1+Vth. VCLMP1<VDD, and Vth is the threshold value of the transistor YBLe. Further, the gate of the transistor YBLo is transitioned to GND, the transistor YBLo is turned off, the gate of the transistor BLSo is transitioned from GND to the H level, and the transistor BLSo is turned on. As a result, the non-selected bit line GBLo is disconnected from the virtual power supply VIRPWR, the non-selected bit line GBLo is electrically connected to GND of the voltage supply node V1 through the transistor BLS, the transistor BLCN, the transistor BLCLAMP, and the transistor BLPRE, and the non-selected bit line GBLo is bit-line shielded (step #1_1).

At the time t3, the virtual power supply VIRPWR is transitioned to VDD, and precharging of the selected bit line GBLe is started (step #1). The transistor BLSe is turned off and the selected bit line GBLe is disconnected from the node BLS. The voltage VCLMP1+Vth is applied to the gate of the transistor YBLe, and a voltage is supplied to the selected bit line GBLe through the transistor YBLe. The precharging period is from the time t3 to the time t8.

During the precharging period of the selected bit line GBLe, the non-selected bit line GBLo is disconnected from the virtual power supply VIRPWR but is electrically connected to the GND of the voltage supply node V1 through the transistor BLSo, the transistor BLCN, the transistor BLCLAMP, and the transistor BLPRE. However, the voltage of the non-selected bit line GBLo rises to some extent due to the capacitive coupling with the selected bit line GBLe, and accordingly, the voltages of the node BLS, the node TOBL, the reading node SNS, and the voltage supply node V1 also rise to some extent, but if the selected bit line is fully charged, the effect of the driving capability that the voltage supply node V1 forcibly sets the non-selected bit line GBLo, the node BLS, and the node TOBL to GND is greater than the voltage rise effect caused by the capacitive coupling. As a result, the non-selected bit line GBLo, the node BLS, the node TOBL, the reading node SNS, and the voltage supply node V1 return to GND.

During the period from the time t4 to the time t5, the transistor BLCD1 is transitioned from GND to the H level, the transistor BLCD1 is turned on, and the node SLR1 of the latch L1 is electrically connected to the GND level of the voltage supply node V1, thereby resetting the latch L1 (step #1_2). In addition, the voltage rise effect of the capacitive coupling causes the voltages of the voltage supply node V1 and the reading node SNS to rise to some extent, but since the driving capability of the voltage supply node V1 for forcibly setting the reading node SNS to GND is sufficiently strong, it does not affect step #1_2.

At the time t6, after securing a sufficient bit line precharging time, the gate of the transistor BLSo is transitioned from the H level to the L level, and the transistor BLSo is turned off. As a result, the non-selected bit line GBLo is disconnected from the node BLS, and the non-selected bit line GBLo becomes floating from the shielded state. The transistor BLSo is turned on from the time t2 to the time t6, and during this period, the non-selected bit line GBLo is electrically connected to the GND level, and the selected bit line GBLe is fully charged, which prevents the voltage of the non-selected bit line GBLo from floating greatly due to the capacitive coupling.

At the time t7, the voltage supply node V1 is transitioned from GND to VDD, and during the period from the time t7 to the time t8, the reading node SNS is charged to VDD, and the node TOBL and the node BLS are charged to the voltage VCLMP1 or VDD to initialize the page buffer/reading circuit 170 (step #1_3). Since the initialization of the page buffer/reading circuit 170 is performed during the precharging period of the selected bit line, the time required to initialize the page buffer/reading circuit 170 is effectively hidden by the precharging period. Further, since the page buffer/reading circuit 170 is initialized at the end of the precharging period, it is possible to prevent the voltage of the non-selected bit line in the floating state from floating due to capacitive coupling. In addition, at the time t7, the transistor YBLe may be turned off, and at the time t8, the transistor BLSe may be turned on, and the node BLS and the selected bit line GBLe may be electrically connected to align the minute potential differences generated at the node TOBL, the node BLS, and the selected bit line GBLe. At this time, the node TOBL and the node BLS are charged to VCLMP1 from the time t7 to the time t8. When the precharging of the selected bit line GBLe is completed, the discharging of the cells and the reading of the read data are performed, and the read data is held in the latch L1 at the reading node SNS.

Thus, according to the high-speed reading mode of this embodiment, the latch L1 is initialized and the page buffer/reading circuit is initialized in parallel with the precharging of the selected bit line. Therefore, high-speed reading can be performed as compared with the conventional technology in which these operations are performed sequentially. For example, in the conventional reading method, it takes about 7 μs to 8 μs to set up the page buffer/reading circuit and the bit line, but the time can be shortened to 2 μs to 3 μs in the high-speed reading mode of this embodiment.

In the above embodiment, the latch L1 is initialized and the page buffer/reading circuit 170 is initialized during the precharging period of the selected bit line. However, at least the initialization of the latch L1 may be performed during the precharging period of the selected bit line to shorten the reading time. Furthermore, although the above embodiment illustrates the reading operation for a single page, the high-speed reading mode of this embodiment can also be applied to the reading operation for a plurality of pages.

Next, the second embodiment of the disclosure will be described. The second embodiment relates to a method of precharging the selected bit line. In the conventional flash memory, when the selected bit line is precharged, the voltage VCLMP1+Vth_BL (Vth_BL is the threshold value of the transistor BLCLAMP) is applied to the gate of the transistor BLCLAMP to generate the VCLMP1 level on the selected bit line. In addition, at the time of cell discharging, the voltage VCLMP2+Vth_BL is applied to the gate of the transistor BLCLAMP (VCLMP2<VCLMP1). In contrast thereto, in this embodiment, the voltage VCLMP1+Vth_YBL (Vth_YBL is the threshold value of the transistors YBLe/YBLo) is applied to the gate of the transistors YBLe/YBLo to generate the VLCMP1 level on the selected bit line.

Figure 9:
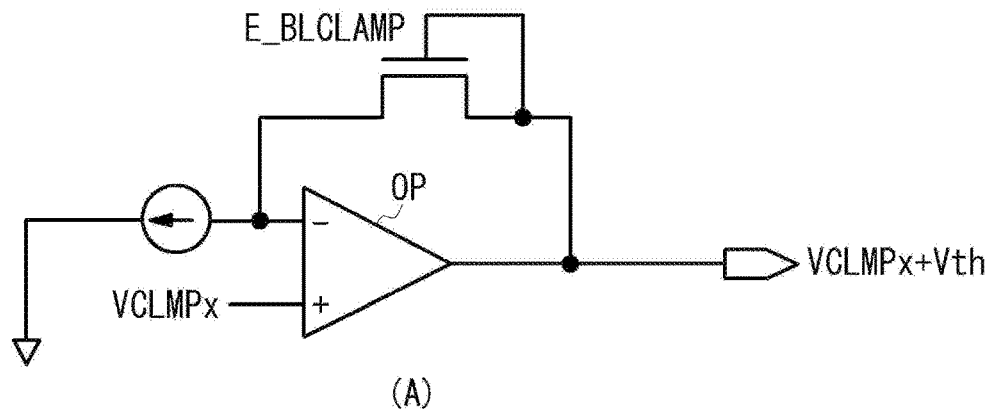
FIGS. 9(A) and (B) are diagrams showing the configuration of a voltage generation circuit according to the second embodiment of the disclosure.
Figure 9:
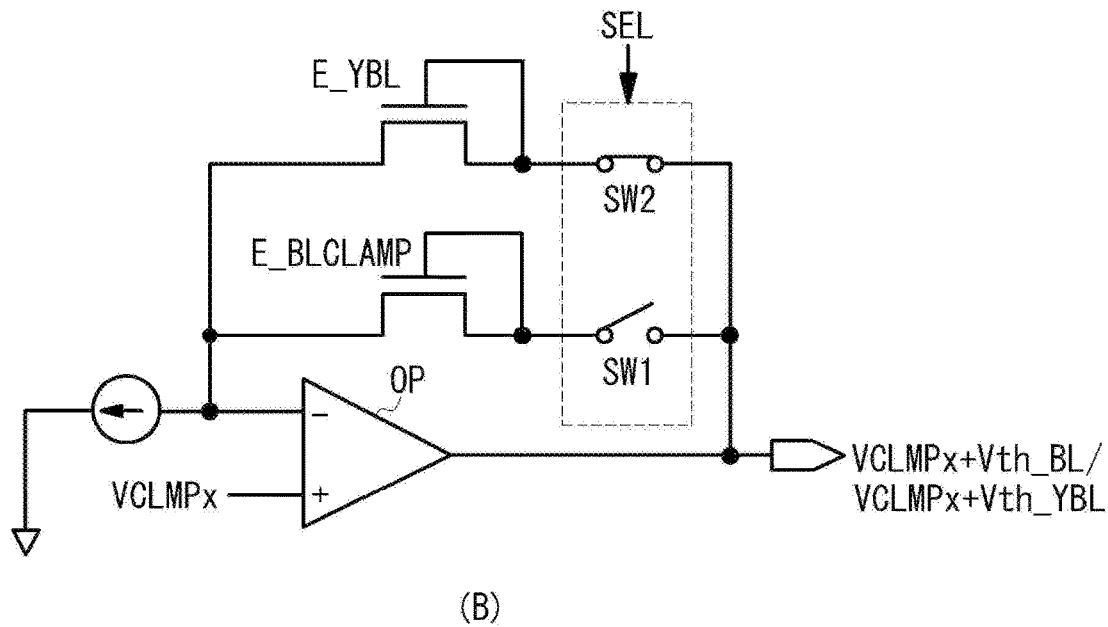

FIG. 9(A) shows a conventional voltage generation circuit. The voltage generation circuit includes an operational amplifier OP and the transistor E_BLCLAMP. The voltage VCLMPx is supplied to the non-inverting input terminal (+) of the operational amplifier OP, a constant current source is supplied to the inverting input terminal (−), and the transistor E_BLCLAMP is diode-connected to provide negative feedback between the output and the inverting input terminal of the operational amplifier OP. The transistor E_BLCLAMP is an emulation transistor of the transistor BLCLAMP, and VCLMPx+Vth (Vth is the threshold value of the transistor E_BLCLAMP, and Vth≈the threshold value Vth of the transistor BLCLAMP) is generated at the output of the operational amplifier OP. In addition, when the selected bit line is precharged, VCLMPx=VCLMP1, and when the cell is discharged, VCLMPx=VCLMP2, and VCLMPx is a general term for VCLMP1/VCLMP2.

FIG. 9(B) shows a voltage generation circuit of this embodiment. In addition to the configuration shown in FIG. 9(A), the voltage generation circuit of this embodiment further includes: a transistor E_YBL connected in parallel to the transistor E_BLCLAMP, a switch SW1 connected between the transistor E_BLCLAMP and the output, and a switch SW2 connected between the transistor E_YBL and the output. The transistor E_YBL is an emulation transistor of the transistors YBLe/YBLo. The transistor BLCLAMP is a transistor that can operate at a low voltage, and the transistors YBLe/YBLo are transistor having a withstand voltage against the high voltage of the bit line, and the threshold values of them are different. Therefore, two transistors, the transistor E_BLCLAMP and the transistor E_YBL, are required.

The switches SW1 and SW2 open and close the route in response to the control signal SEL from the controller 150. That is, when the selected bit line is precharged, the switch SW1 is opened and the switch SW2 is closed. As a result, the voltage generation circuit outputs the voltage VCLMPx+Vth_YBL, and the voltage VCLMPx+Vth_YBL is applied to the gate of the transistor connected to the selected bit line among the transistors YBLe/YBLo (corresponding to the gate voltage VCLMP1+Vth of the transistor YBLe in FIG. 8). On the other hand, when the cell is discharged, the switch SW1 is closed and the switch SW2 is opened. As a result, the voltage generation circuit outputs the voltage VCLMPx+Vth_BL, and the voltage VCLMPx+Vth_BL is applied to the gate of the transistor BLCLAMP.

According to the voltage generation circuit of this embodiment, the gate voltage VCLMPx+Vth_BL for the transistor BLCLAMP or the gate voltage VCLMPx+Vth_YBL for the transistors YBLe/YBLo can be selectively generated. Further, by using a constant current source and the diode-connected transistor E_YBL for the negative feedback of the operational amplifier, a highly accurate voltage can be generated. Furthermore, the voltage generation circuit of this embodiment may be included in the virtual power supply VIRPWR or may be provided separately from the virtual power supply VIRPWR.

Figure 10:
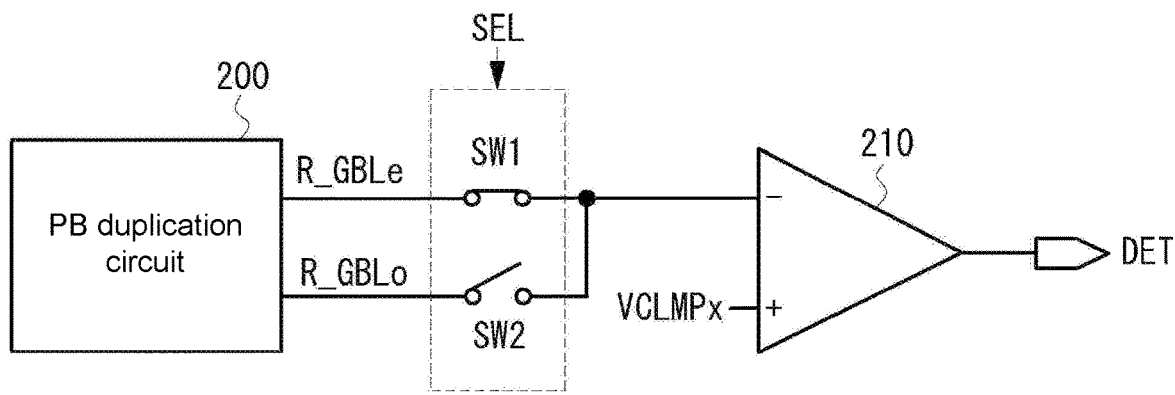
FIG. 10 is a diagram showing the configuration of a voltage generation circuit according to the third embodiment of the disclosure.

Next, the third embodiment of the disclosure will be described. FIG. 10 is a diagram showing the configuration of a voltage generation circuit according to the third embodiment. As shown in the figure, the voltage generation circuit includes: a PB duplication circuit 200 which duplicates the page buffer/reading circuit 170 (for example, the configuration shown in FIG. 1); an even-numbered bit line R_GBLe and an odd-numbered bit line R_GBLo for duplication connected to the PB duplication circuit 200; a switch SW1 connected to the even-numbered bit line R_GBLe; a switch SW2 connected to the odd-numbered bit line R_GBLo; and a comparator 210 which connects a common node of the switch SW1 and the switch SW2 to the inverting input terminal (−) and connects the voltage VCLMPx to the non-inverting input terminal (+).

The switches SW1 and SW2 open and close the route in response to the control signal SEL from the controller 150. When the even-numbered bit line GBLe is precharged, the switch SW1 is closed and the switch SW2 is opened, and when the odd-numbered bit line GBLo is precharged, the switch SW1 is opened and the switch SW2 is closed.

When the selected bit line is precharged, the virtual power supply VIRPWR supplies VDD to both the page buffer/reading circuit 170 and the PB duplication circuit 200, a sufficiently large voltage (for example, a gate voltage obtained by boosting VDD by a bootstrap or the like) is applied to the gate of the transistor connected to the selected bit line among the transistors YBLe/YBLo, and voltage supply at the VDD level is started on the selected bit line. As a result, the selected bit line is precharged more rapidly than in the second embodiment. The comparator 210 compares the duplication voltage of the even-numbered bit line R_GBLe or the odd-numbered bit line R_GBLo for duplication with VCLMPx, and outputs the H-level detection signal DET when the duplication voltage<VCLMPx and outputs the L-level detection signal DET when the duplication voltage≥VCLMPx. When the detection signal DET transitions to the L level, in response thereto, the controller 150 turns off the transistor connected to the selected bit line, among the transistors YBLe/YBLo, so as to end the precharging of the selected bit line.

According to this embodiment, the transistor connected to the selected bit line, among the transistors YBLe/YBLo, is strongly turned on to supply a large drain current to the selected bit line until the selected bit line reaches the precharge level, so as to shorten the precharging time of the selected bit line.

Figure 11:
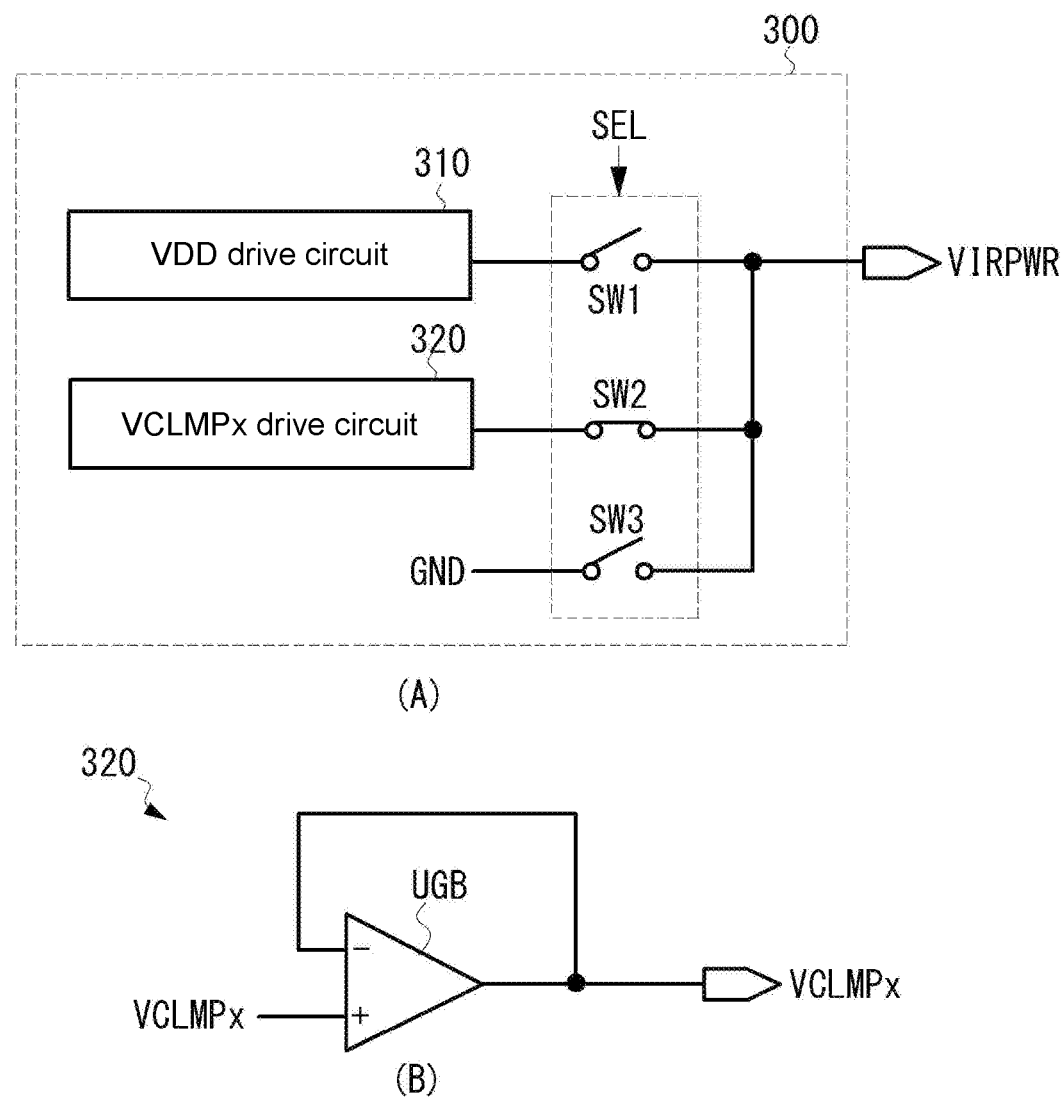
FIGS. 11(A) and (B) are diagrams showing the configuration of a voltage generation circuit of a virtual power supply according to the fourth embodiment of the disclosure.

Next, the fourth embodiment of the disclosure will be described. FIGS. 11(A) and (B) are diagrams showing the configuration of a voltage generation circuit of a virtual power supply according to the fourth embodiment. The voltage generation circuit 300 of the virtual power supply includes: a VDD drive circuit 310, a VCLMPx drive circuit 320, a switch SW1 connected between the VDD drive circuit 310 and the output VIRPWR, a switch SW2 connected between the VCLMPx drive circuit 320 and the output VIRPWR, and a switch SW3 connected between GND and the output VIRPWR. However, it should be noted that the voltage generation circuit 300 can generate other voltages in addition to the above-mentioned voltage.

The switch SW1, the switch SW2, and the switch SW3 open and close the route according to the control signal SEL from the controller 150. When the selected bit line is precharged, the switch SW2 is closed, the switch SW1 and the switch SW3 are opened, and the voltage VCLMPx is generated at the output VIRPWR. At this time, a sufficiently large voltage (for example, a voltage obtained by boosting the voltage VCLMPx or VDD) is applied to the gate of the transistor connected to the selected bit line among the transistors YBLe/YBLo, and the voltage VCLMPx is supplied to the selected bit line. On the other hand, when the selected bit line is initialized (step #0 in FIG. 6), the switch SW1 and the switch SW2 are opened, the switch SW3 is closed, and GND is supplied to the output VIRPWR. Furthermore, when VDD is supplied from the output VIRPWR, the switch SW1 is closed, and the switch SW2 and the switch SW3 are opened.

FIG. 11(B) is a diagram showing the configuration of the VCLMPx drive circuit 320. The drive circuit 320 includes a unity gain buffer UGB in which the voltage VCLMPx is supplied to the non-inverting input terminal (+) of the unity gain buffer UGB, and output is negatively fed back to the inverting input terminal (−). The unity gain buffer UGB outputs a voltage equal to the input voltage VCLMPx.

By using the unity gain buffer UGB as in this embodiment, it is possible to generate a highly accurate voltage VCLMPx. Further, by strongly turning on the transistor connected to the selected bit line, among the transistors YBLe/YBLo, a large drain current can be supplied to the selected bit line to shorten the precharging time of the selected bit line.

Although exemplary embodiments of the disclosure have been described in detail above, the disclosure is not limited to the specific embodiments, and various modifications and changes can be made without departing from the scope of the gist of the disclosure defined in the claims.

What is claimed is:

1. A reading method of a NAND flash memory, which comprises a bit line selection circuit selecting an even-numbered bit line or an odd-numbered bit line and a page buffer/reading circuit connected to the bit line selection circuit, the reading method comprising:
   a first step of precharging a selected bit line with a supply voltage of a first voltage supply source connected to the bit line selection circuit; and
   a second step of initializing a latch of the page buffer/reading circuit with a supply voltage of a second voltage supply source connected to the page buffer/reading circuit in parallel with precharging of the selected bit line.

2. The reading method according to claim 1, further comprising:
   a third step of initializing a reading node of the page buffer/reading circuit with the supply voltage of the second voltage supply source after initializing the latch in parallel with precharging of the selected bit line.

3. The reading method according to claim 1, wherein the second step and the third step are performed in a precharging period of the selected bit line, and the second voltage supply source supplies a ground level for the second step and supplies an internal supply voltage for the third step.

4. The reading method according to claim 1, further comprising:
   a fourth step of initializing the selected bit line with the supply voltage of the first voltage supply source before precharging of the selected bit line.

5. The reading method according to claim 1, further comprising:
   a fifth step of bit-line shielding a non-selected bit line with the supply voltage of the second voltage supply source.

6. The reading method according to claim 5, wherein the fifth step further comprises connecting the supply voltage of the first voltage supply source to the non-selected bit line, and connecting the bit line selection circuit to the page buffer/reading circuit, wherein the fifth step and the second step are performed simultaneously.

7. The reading method according to claim 1, wherein when precharging of the selected bit line is started, a transistor connected between the first voltage supply source and the selected bit line is turned on, the first voltage supply source supplies a voltage at a precharge level, and the transistor is turned on so that the precharge level does not drop.

8. A semiconductor device, comprising:
   a NAND memory cell array;
   a reading component reading data from a selected page of the memory cell array; and
   an output component outputting the data read by the reading component to outside,
   wherein the reading component comprises a bit line selection circuit selecting an even-numbered bit line or an odd-numbered bit line, and a page buffer/reading circuit connected to the bit line selection circuit,
   the reading component precharges a selected bit line with a supply voltage of a first voltage supply source connected to the bit line selection circuit, and initializes a latch of the page buffer/reading circuit with a supply voltage of a second voltage supply source connected to the page buffer/reading circuit in parallel with precharging of the selected bit line.

9. The semiconductor device according to claim 8, wherein the reading component further initializes a reading node of the page buffer/reading circuit with the supply voltage of the second voltage supply source after initializing the latch in parallel with precharging of the selected bit line.

10. The semiconductor device according to claim 8, wherein the reading component further initializes the selected bit line with the supply voltage of the first voltage supply source before precharging of the selected bit line.

11. The semiconductor device according to claim 8, wherein the reading component further performs bit-line shielding on a non-selected bit line with the supply voltage of the second voltage supply source, and the reading component further performs bit-line shielding on the non-selected bit line and initializes the latch simultaneously.

12. The semiconductor device according to claim 8, wherein a transistor connected between the first voltage supply source and the selected bit line is turned on when precharging of the selected bit line is started.

13. The semiconductor device according to claim 8, wherein the reading component comprises a detecting component detecting a voltage of a bit line, and the reading component turns on the transistor so that the supply voltage of the first voltage supply source does not drop, and turns off the transistor when a precharge voltage is detected by the detecting component.

14. The semiconductor device according to claim 8, wherein the reading component outputs a voltage at a precharge level from the first voltage supply source, and turns on the transistor so that the voltage at the precharge level does not drop.

15. The semiconductor device according to claim 8, wherein the reading component comprises a unity gain buffer that outputs the voltage at the precharge level.

* * * * *